US011511999B2

(12) United States Patent
Choudhary et al.

(10) Patent No.: US 11,511,999 B2
(45) Date of Patent: Nov. 29, 2022

(54) PROCESS FOR PRODUCING GRAPHENE BASED TRANSPARENT CONDUCTIVE ELECTRODE AND THE PRODUCT THEREOF

(71) Applicants: Tata Steel Limited, Mumbai (IN); Centre for Nano and Soft Matter Sciences, Bangalore (IN)

(72) Inventors: Shyam Kumar Choudhary, Mumbai (IN); Sumitesh Das, Mumbai (IN); Giridhar Udapi Rao Kulkarni, Bangalore (IN); Rajashekhar Ningappa Pujar, Bangalore (IN)

(73) Assignees: Tata Steel Limited and Centre for Nano; Soft Matter Sciences

( * ) Notice: Subject to any disclaimer, the term of this patent is extended or adjusted under 35 U.S.C. 154(b) by 184 days.

(21) Appl. No.: 16/622,731

(22) PCT Filed: Mar. 23, 2018

(86) PCT No.: PCT/IB2018/051966
§ 371 (c)(1),
(2) Date: Dec. 13, 2019

(87) PCT Pub. No.: WO2018/229561
PCT Pub. Date: Dec. 20, 2018

(65) Prior Publication Data
US 2021/0139333 A1 May 13, 2021

(30) Foreign Application Priority Data
Jun. 15, 2017 (IN) .............................. 201721021005

(51) Int. Cl.
*C01B 32/186* (2017.01)
*C01B 32/194* (2017.01)
(Continued)

(52) U.S. Cl.
CPC .......... *C01B 32/186* (2017.08); *C01B 32/194* (2017.08); *C23C 14/18* (2013.01);
(Continued)

(58) Field of Classification Search
CPC ...... B82Y 40/00; H01M 4/133; C01B 32/186; C01B 32/194; C01B 2204/04; C01B 2204/22; C23C 14/18; C23C 14/24
(Continued)

(56) References Cited

U.S. PATENT DOCUMENTS

| 10,807,871 | B2 * | 10/2020 | Choudhary | ............. C01B 32/16 |
| 2013/0133925 | A1 * | 5/2013 | Kim | ........................ H01B 1/24 |
| | | | | 174/126.4 |
| 2014/0030600 | A1 | 1/2014 | Kwon | |

FOREIGN PATENT DOCUMENTS

| CN | 102569432 | 7/2012 |
| WO | WO 2014/136039 | 9/2014 |
| WO | WO 2015/04063 0 | 3/2015 |

OTHER PUBLICATIONS

Singhbabu "Observation of large positive magneto-resistance in bubble decorated graphene oxide films derived from shellac biopolymer: a new carbon source and facile method for morphology-controlled." Nanoscale, 2015, 7, 6510-6519 (Year: 2015).*
(Continued)

*Primary Examiner* — Tri V Nguyen
(74) *Attorney, Agent, or Firm* — Fish & Richardson P.C.

(57) ABSTRACT

The present disclosure relates to production of electrodes. The present disclosure particularly relates to production of graphene based transparent conducting electrode (TCE). The disclosure provides a simple and environmental friendly process for producing said graphene based TCE by coating of graphene on a modified or non-modified substrate. Said electrode provides large area metal network with reduced non-uniformity of conducting film, visible transparency and
(Continued)

low or reduced sheet resistance. The disclosure further relates to a graphene based transparent conductive electrode (TCE).

16 Claims, 8 Drawing Sheets

(51) Int. Cl.
  C23C 14/18  (2006.01)
  C23C 14/24  (2006.01)
  H01L 31/0224  (2006.01)
  H01L 33/42  (2010.01)

(52) U.S. Cl.
  CPC .......... *C23C 14/24* (2013.01); *C01B 2204/04* (2013.01); *C01B 2204/22* (2013.01); *C01P 2002/82* (2013.01); *C01P 2004/03* (2013.01); *H01L 31/022466* (2013.01); *H01L 33/42* (2013.01)

(58) Field of Classification Search
  USPC .......................... 423/448, 460; 252/500, 510
  See application file for complete search history.

(56) References Cited

OTHER PUBLICATIONS

International Preliminary Report on Patentability in International Appln. No. PCT/IB2018/051966, dated Dec. 17, 2019, 7 pages.
International Search Report and Written Opinion in International Appln. No. PCT/IB2018/051966, dated Jun. 19, 2018, 10 pages.
Raifiee et al., "Wetting transparency of graphene," Nature Materials, Mar. 1, 2012, 11(3):217-222.
Rao et al., "Fabrication of Large Area, High-Performance, Transparent Conducting Electrodes Using a Spontaneously Formed Crackle Network as Template," Adv. Mater. Interfaces, 2014, 1400090:1-7.
Shin et al., "Surface-Energy Engineering of Graphene," Langmuir, Mar. 16, 2010, 26(6):3798-3802.

* cited by examiner

US 11,511,999 B2

PROCESS FOR PRODUCING GRAPHENE BASED TRANSPARENT CONDUCTIVE ELECTRODE AND THE PRODUCT THEREOF

TECHNICAL FIELD

The present disclosure relates to production of electrodes. The present disclosure particularly relates to production of graphene based transparent conducting electrode (TCE). The disclosure provides a process for producing said graphene based TCE by coating graphene on a modified or non-modified substrate. Said graphene based TCE provides reduced non-uniformity of conducting film, visible transparency and demonstrates low or reduced sheet resistance. The disclosure further relates to a graphene based transparent conductive electrode (TCE).

BACKGROUND OF THE DISCLOSURE

Transparent conducting electrode is used in display devices, touch screens solar cell etc. Indium tin oxide (ITO) is a commonly used material to achieve both transparency and conductivity, which applied as a coating on transparent substrates like glass to obtain transparent conducting electrode.

In spite of commercial use of ITO based transparent electrodes, its application in flexible electronics remained a challenge owing to brittle nature of ITO. Moreover, cost of ITO based transparent electrode is rising exponentially due to limited resource of Indium.

There are efforts to identify alternates to ITO such as silver nanowires and carbon nanotubes for preparing transparent electrode by laying or coating the said silver nanowires and carbon nanotubes on a transparent substrate. However, said alternate methodologies have their own limitations such as fluctuation in conductivity in the film widely depending on nanowires density and the interconnections contact resistance between nanowires. Moreover, random arrangement of nanowires on substrates also leaves non-conducting islands between the gap regions which limits its application in the area of optoelectronics such as photovoltaic etc.

In view of the abovementioned limitations/shortcomings in the process of preparation of transparent conducting electrodes, there appears to be a need to develop a superior process devoid of such limitation/shortcomings.

SUMMARY OF THE DISCLOSURE

The present disclosure overcomes the limitation/shortcomings of the processes known for producing transparent conducting electrodes until the priority date of this application.

Accordingly, the present disclosure relates to a process for producing graphene based TCE, wherein said process comprises steps of:
heating a modified substrate or a non-modified substrate and at least one feeder;
contacting vapours of seedlac with the modified substrate or the non-modified substrate;
cooling the modified substrate to obtain a coat of graphene on the modified substrate, thereby producing graphene based TCE; or
cooling the non-modified substrate to obtain a coat of graphene on the non-modified substrate, followed by coating the graphene coated non-modified substrate with metal precursor, and washing the graphene coated non-modified substrate to produce graphene based TCE.

In another embodiment, the present disclosure relates to graphene based transparent conducting electrode (TCE).

BRIEF DESCRIPTION OF THE ACCOMPANYING FIGURES

In order that the disclosure may be readily understood and put into practical effect, reference will now be made to exemplary embodiments as illustrated with reference to the accompanying figures. The figures together with detailed description below, are incorporated in and form part of the specification, and serve to further illustrate the embodiments and explain various principles and advantages, in accordance with the present disclosure where:

FIG. 1 illustrates experimental step up for production of graphene based TCE from modified substrate.

FIG. 2 illustrates a microscopic optical and scanning electron microscope (SEM) images with different magnifications of the hybrid TCE comprising Graphene, wherein inset of (a) illustrates digital image of the graphene film lodged on metal mesh of the transparent material (modified substrate); (a) to (c) illustrates optical microscopic images with different magnifications (100 µm, 50 µm and 25 µm); and (d) to (f) illustrates SEM images of graphene film lodged on metal mesh of the modified substrate. Observed charging is in voids of metal network due to no conducting region on substrate having only metal network and absence of charging on hybrid graphene metal network due to presence of graphene providing new channels in between the metal wires to collect the charge carriers.

FIG. 3 illustrates Raman spectra of Graphene of the graphene based TCE and Transmission spectrum of Graphene of the graphene based TCE, wherein(a) illustrates Raman spectra of graphene film on metal mesh of the transparent material (modified substrate) and off the metal mesh of the transparent material (modified substrate). Inset of (a) shows the optical microscopic images where the Raman spectrum is recorded; and (b) illustrates comparison of Transmission spectrum of the graphene of graphene based TCE and transparent material such as quartz.

FIG. 4 illustrates robustness of the graphene based TCE against ferric chloride etching in comparison to metal wire mesh (modified substrate) without graphene, wherein (a) and (c) illustrate optical microscopic images taken before etching Cu mesh and Graphene based TCE having Cu mesh; and (b) and (d) illustrate optical microscopic images taken after 30 seconds of etching respectively; (e) illustrates the resistance of Cu mesh and Graphene based TCE having Cu mesh measured over a time period of 60 s.

Figure 7:
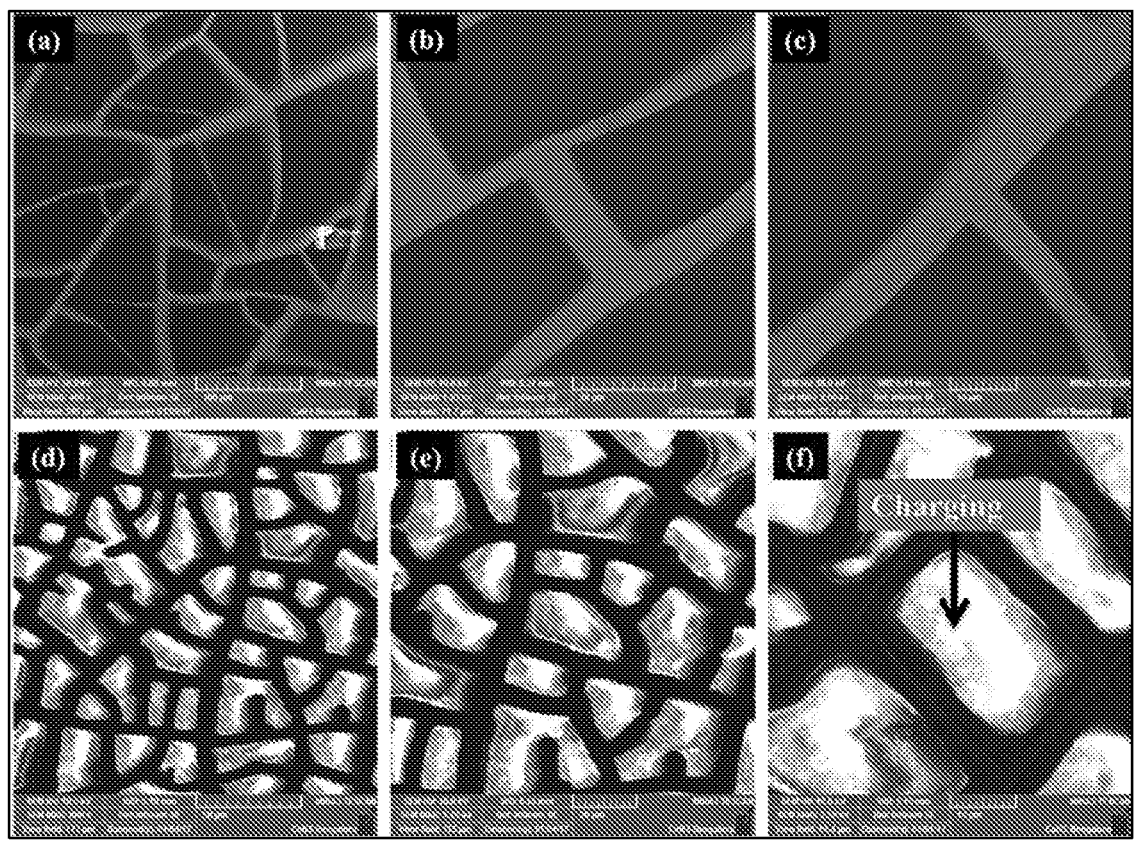

FIG. 7 (SEM images of metal mesh/graphene on quartz) illustrates observed charging is in voids of metal network due to no conducting region on substrate having only metal network and absence of charging on hybrid graphene metal network due to presence of graphene providing new channels in between the metal wires to collect the charge carriers.

Figure 8:
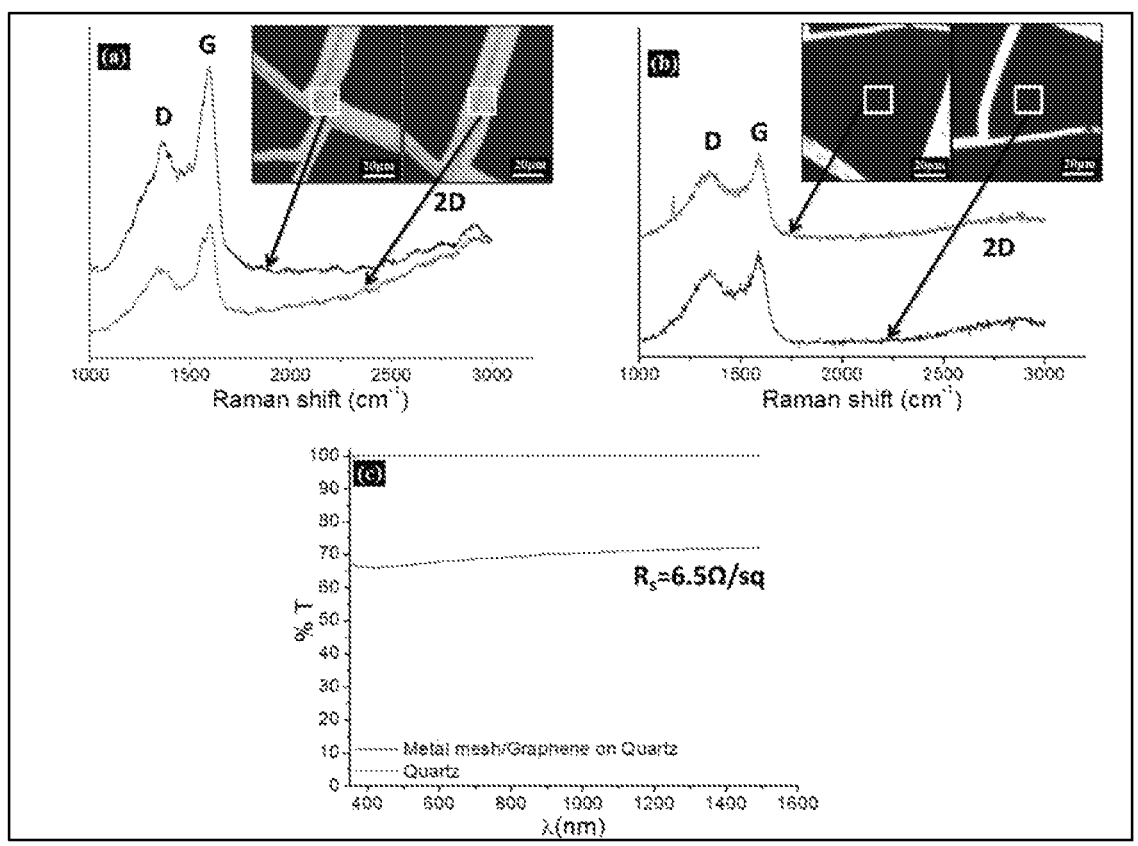

FIG. 8 illustrates Raman spectra of Graphene and Transmission spectrum at different regions of the said Graphene. (a)Raman spectra of graphene film on metal mesh and (b) off the metal mesh is recorded. Inset shows the optical microscopic images where the Raman spectrum is recorded. (c) Transmission spectrum of the film compared with quartz substrate.

Figure 9:
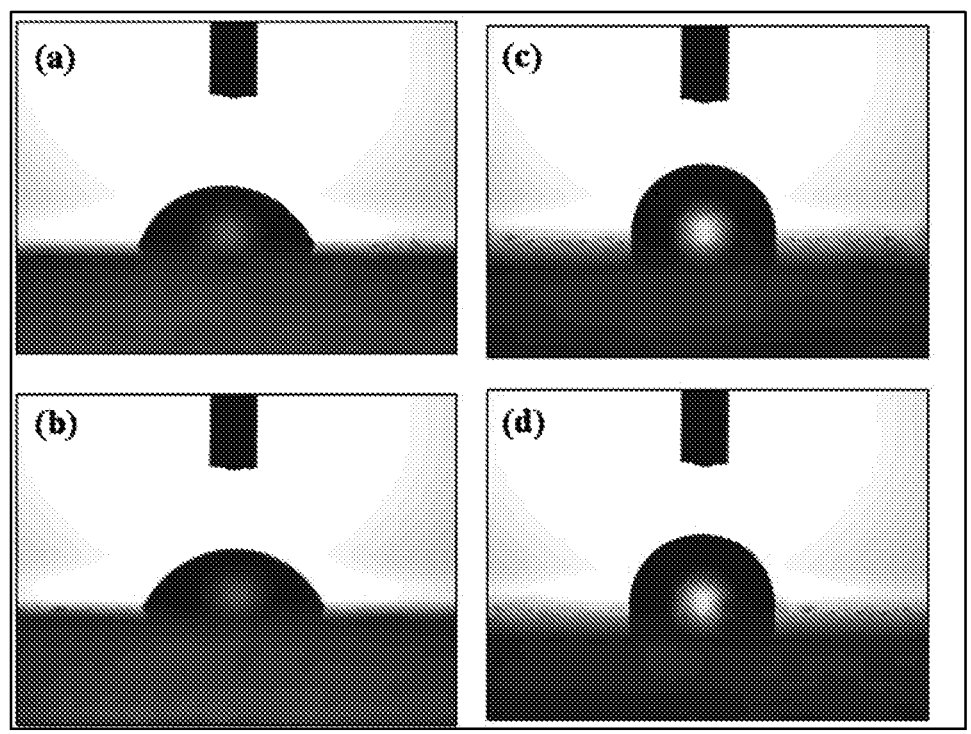

FIG. 9 illustrates measurement of contact angle of the graphene based TCE. (a-b) Digital images of contact angle measured with 3 µL drop on Cu mesh/quartz and (c-d) graphene/Cu mesh/quartz.

Figure 10:
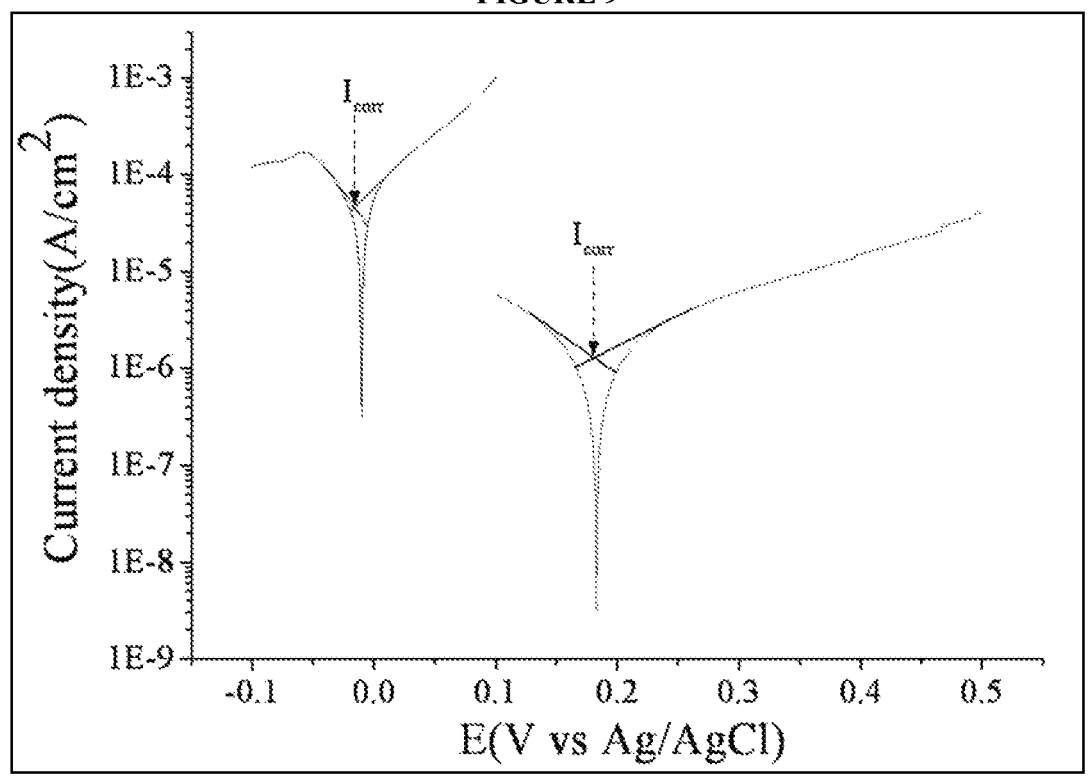

FIG. 10 illustrates corrosion resistant studies of graphene coated Cu-mesh; Tafel plot (sweep rate: 5 mV/s) for Cu mesh (black) and graphene coated Cu-mesh (red).

DETAILED DESCRIPTION

As used herein, the term multi-layer depicts the presence of at least one layer of metal and/or graphene on the surface of a substrate.

As used herein, the abbreviation TCE represents the phrase 'Transparent Conducting Electrode'.

As used herein, the terms 'cracked template' and 'crackled template' have been used interchangeably wherein said terms depict a surface comprising cracks by virtue of the presence of a cracked film of dried colloidal suspension on the surface of the substrate. The cracks may extend deep down to the substrate. Said cracked surface thereafter forms a template for formation of a metal mesh.

As used herein, the terms 'metal mesh', 'metallic mesh', 'cracked metal mesh', 'metal network' or 'metallic network' have been used interchangeably wherein said terms depict a network of metallic material formed by virtue of metal deposition on a cracked template.

As used herein, the terms 'conducting' and 'conductive' have been used interchangeably wherein said terms depict the property of conductivity of the electrode of the invention.

As used herein, the usage 'graphene/metal/substrate' or 'Gr/metal/substrate' refer to a TCE wherein the layers from inside to outside are substrate, metal mesh and then graphene.

As used herein, the usage 'metal/graphene/substrate' or 'metal/Gr/substrate' refer to a TCE wherein the layers from inside to outside are substrate, graphene and then metal mesh.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The use of the expression "at least" or "at least one" suggests the use of one or more elements or ingredients or quantities, as the use may be in the embodiment of the disclosure to achieve one or more of the desired objects or results. Throughout this specification, the word "comprise", or variations such as "comprises" or "comprising" wherever used, will be understood to imply the inclusion of a stated element, integer or step, or group of elements, integers or steps, but not the exclusion of any other element, integer or step, or group of elements, integers or steps.

The present disclosure relates to process for producing electrodes, particularly graphene based transparent conductive electrode.

The process described in the present disclosure is a simple process to produce graphene based transparent conductive electrode, wherein the said graphene based transparent conductive electrode has single or multi-layers of graphene. Said process is commercially viable and overcomes the limitation and/or shortcomings associated with known processes available to produce transparent conducting electrode.

The process for producing graphene based TCE, wherein said process comprises steps of:
heating a modified substrate or a non-modified substrate and at least one feeder;
contacting vapours of seedlac with the modified substrate or the non-modified substrate;
cooling the modified substrate to obtain a coat of graphene on the modified substrate, thereby producing graphene based TCE; or
cooling the non-modified substrate to obtain a coat of graphene on the non-modified substrate, followed by coating the graphene coated non-modified substrate with metal precursor, and washing the graphene coated non-modified substrate to produce graphene based TCE.

In an embodiment, the modified or the non-modified substrate and the feeder comprising the seedlac are heated to a temperature ranging from about 400° C. to 1200° C. under vacuum at pressure ranging from about $10^{-1}$ mbar to $10^{-5}$ mbar for a time period ranging from about 1 minute to 120 minutes, whereby the seedlac on the feeder is vaporized and the substrate is contacted with the seedlac. The heating is done in a furnace, wherein the furnace is any electronic heating furnace, capable of being heated to a predetermined temperature.

In an alternate embodiment, the modified or the non-modified substrate and the feeder comprising the seedlac are heated to a temperature ranging from about 400° C. to 1200° C. under controlled atmosphere comprising argon, combination of argon and hydrogen or combination of nitrogen and hydrogen at a flow rate ranging from about 100sccm to 500sccm for a time period ranging from about 1 minute to 120 minutes, whereby the seedlac on the feeder is vaporized and the substrate is contacted with the seedlac.

In an embodiment, heating of the modified or non-modified substrate and the at least one feeder comprising the seedlac causes the seedlac to vaporize and contact the modified substrate or non-modified substrate, thereby forming graphene coat on the modified substrate or the non-modified substrate upon cooling to a temperature ranging from about 25° C. to 50° C.

In another embodiment, the temperature for the cooling is about 25° C., about 30° C., about 35° C., about 40° C., about 45° C. or about 50° C.

In an embodiment, the modified substrate comprises a transparent material coated with a cracked metal mesh on its surface.

In an embodiment, the modified substrate comprises a transparent material having cracked metal, optionally along with colloidal film, wherein the modified substrate is produced by a process comprising steps of:
coating colloidal solution on the transparent material;
drying the colloidal solution on the transparent material to obtain crackle template; and
coating a metal on the crackle template, followed by washing the template to obtain the modified substrate.

In an embodiment, the colloidal solution comprises colloidal matter selected from a group comprising acrylic resin, acrylic resin nanoparticles, titanium dioxide, potassium tetraoctyl ammonium bromide, palladium benzyl thiolate, palladium hexadecylthiolate coffee powder and colloidal nanoparticles of other substances or any combination thereof.

In a preferred embodiment, the colloidal solution is an acrylic resin water based dispersion available commercially as crackle nail polish (Ming Ni Cosmetics Co., Guangzhou, China).

In an embodiment, solvent for preparing the colloidal solution is selected from a group comprising water, toluene, acetone, chloroform, ethyl alcohol, isopropyl alcohol, ethyl acetate, butyl acetate and methanol or any combination thereof.

In an embodiment, in the process of the present disclosure, the colloidal solution has particle size ranging from about 1 nm to 1000 nm, preferably ranging from about 10 nm to 150 nm.

In another embodiment, in the process of the present disclosure, the colloidal solution has particle size of about 10 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm or about 150 nm.

In an embodiment, concentration of colloidal matter in the solution ranges from about 0.05 g/mL to 2 g/mL.

In another embodiment, the concentration of colloidal matter in the solution is about 0.05 g/mL, about 0.25 g/mL, about 0.5 g/mL, about 0.75 g/mL, about 1 g/mL, about 1.25 g/mL, about 1.5 g/mL, about 1.75 g/mL or about 2 g/mL.

In an embodiment, volume of colloidal dispersion for coating a 1"×1" substrate is about 60 μl.

In an embodiment, colloidal solution is coated on the transparent material by a technique selected from a group comprising, spin coating, dip coating, spray coating, roll coating or any combinations thereof, wherein the colloidal solution forms a film on the transparent material.

In an embodiment, the crackle template on the transparent material is formed by crackling of the film of colloidal solution, which is initiated through drying.

In a preferred embodiment, colloidal solution is coated on the transparent material by spin coating at 1000 rpm for 60 s at room temperature.

In a non-limiting embodiment, the temperature for spin coating is about 25° C., about 27.5° C., about 30° C., about 32.5° C., about 35° C., about 37.5° C. or about 40° C.

In an embodiment, the drying is carried out by techniques selected from a group comprising self-evaporation, IR radiation, light exposure, heating, spinning, rotating and cooling or any combination thereof.

In another embodiment, the drying is carried out at a temperature ranging from about −73° C. to about 87° C., preferably about 25° C.

In yet another embodiment, the drying is carried out at a temperature of about −73° C., about −65° C., about −60° C., about −55° C., about −50° C., about −45° C., about −40° C., about −35° C., about −30° C., about −25° C,about −20° C., about −15° C., about −10° C., about −5° C., about 0° C., about 5° C., about 10° C., about 15° C., about 20° C., about 25° C., about 30° C., about 35° C., about 40° C., about 45° C., about 50° C., about 55° C., about 60° C., about 65° C., about 70° C., about 75° C., about 80° C., about 85° C. or about 87° C.

In an embodiment, to generate a crackle template, a colloidal dispersion in water/diluter (0.4 g/ml) is rigorously ultrasonicated for 10 min at room temperature (25° C.). Commonly available glass and quartz plates are used as substrates after washing with water, acetone and isopropyl alcohol and purging with nitrogen. 60 μl solution is used for spin coating at 1000 rpm for 60 s at room temperature (25° C.). The substrate gets dried during spin in air while crackle network pattern formed spontaneously in the coated layer.

In an embodiment, thickness of crackle template ranges from about 1 μm to 4 μm.

In a further embodiment, thickness of the crackle template is about 1 μm, 1.5 μm, about 2 μm, about 2.5 μm, about 3 μm, about 3.5 μm or about 4 μm.

The crackle template formed on the transparent material acts as a template mask for coating the metal on the said template.

In an embodiment, the coated metal is in any form selected from a group comprising mesh, wire and thin film or any combination thereof.

In a preferred embodiment, the metal is in the form of wire wherein thickness of the metal wire ranges from about 10 nm-1 μm, preferably about 100 nm.

In a further embodiment, the thickness of the metal wire is about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm or about 1 μm.

In an embodiment, the metal may be any metal or metal alloy except Mercury (Hg).

In a non-limiting embodiment, the metal is selected from a group comprising copper (Cu), silver (Ag), gold (Au), tin(Sn), aluminium (Al), Nickel (Ni) and alloys such as such aluminium (Al)-zinc (Zn) alloy (Al 3003), aluminium (Al)-silica (Si) alloy (Al 4343), copper (Cu)-nickel (Ni), Bronze, nickel (Ni)-chromium (Cr), steel, mild steel or any combinations thereof.

In an embodiment, metal deposition on the crackle template formed facilitates fabrication of patterned modified substrates, which aids in coating of graphene to obtain graphene based transparent conductive electrode (TCE).

In an embodiment, the pattern comprises void region having cell size (i.e. non-metallic region) ranging from about 25 μm to 100 μm, preferably about 30 μm to 40 μm.

In an embodiment, a metal precursor is coated on the crackle template by techniques selected from a group comprising electron beam evaporation (Telemark, USA) and physical vapour deposition system (Hind High Vacuum Co., India) or a combination thereof.

In an embodiment, amount of metal deposited on a template of size of 10 cm×10 cm is ranging from about 100 mg to 2 g, preferably about 400 mg.

In another embodiment, the metal in the form of film has thickness ranging from about 10 nm to 1 μm, preferably about 100 nm.

In a further embodiment, thickness of metal film is about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm or about 1 μm.

In an embodiment, after coating the metal on the crackle template, the modified substrate is subjected to lift-off wherein the crackle layer is dissolved by dipping in chloroform. The modified substrate after lift-off is left with metal network on top of it.

In an embodiment, metal network on the modified substrate is coated with graphene to form the graphene based TCE.

In an embodiment, the non-modified substrate is selected from a group comprising quartz, glass, toughened glass, mica, polymer and, ceramic or any combination thereof.

In another embodiment, the graphene coated non-modified substrate comprises a transparent material coated with a layer of graphene.

In a further embodiment, the graphene coated non-modified substrate is coated with cracked metal mesh on its surface.

In a still further embodiment, the cracked metal mesh on the graphene coated non-modified substrate is formed by coating a metal precursor on a cracked template on the surface of the graphene coated non-modified substrate.

In an alternate embodiment, the instant disclosure relates to a process for producing graphene based TCE comprising steps of:
heating a modified substrate and at least one feeder;
contacting vapours of seedlac with the modified substrate; and
cooling the modified substrate to obtain a coat of graphene on the said modified substrate to produce graphene based transparent conductive electrode.

In an embodiment, the modified substrate and the feeder comprising the seedlac are heated to a temperature ranging from about 400° C. to 1200° C. under vacuum at pressure ranging from about $10^{-1}$ mbar to $10^{-5}$ mbar for a time period ranging from about 1 minute to 120 minutes, whereby the seedlac on the feeder is vaporized and the substrate is contacted with the seedlac. The heating is done in a furnace, wherein the furnace is any electronic heating furnace, capable of being heated to a predetermined temperature.

In an alternate embodiment, the modified substrate and the feeder comprising the seedlacare heated to a temperature ranging from about 400° C. to 1200° C. under controlled atmosphere comprising argon, combination of argon and hydrogen or combination of nitrogen and hydrogen at a flow rate ranging from about 100 sccm to 500 sccm for a time period ranging from about 1 minute to 120 minutes, whereby the seedlac on the feeder is vaporized and the substrate is contacted with the seedlac.

In an embodiment, heating of the modified substrate and the at least one feeder comprising the seedlac causes the seedlac to vaporize and contact the modified substrate, thereby forming graphene coat on the modified substrate upon cooling to a temperature ranging from about 25° C. to 50° C.

In another embodiment, the temperature for the cooling is about 25° C., about 30° C., about 35° C., about 40° C., about 45° C. or about 50° C.

In an embodiment, the modified substrate comprises a transparent material having cracked metal, optionally along with colloidal film, wherein the modified substrate is produced by process comprising steps of:
coating colloidal solution on the transparent material;
drying the colloidal solution on the transparent material to obtain crackle template; and
coating a metal on the crackle template, followed by washing the template to obtain the modified substrate.

In an embodiment, the colloidal solution comprises colloidal matter selected from a group comprising acrylic resin, acrylic resin nanoparticles, titanium dioxide, potassium tetraoctyl ammonium bromide, palladium benzyl thiolate, palladium hexadecylthiolate coffee powder and colloidal nanoparticles of other substances or any combination thereof.

In a preferred embodiment, the colloidal solution is an acrylic resin water based dispersion available commercially as crackle nail polish (Ming Ni Cosmetics Co., Guangzhou, China).

In an embodiment, solvent for preparing the colloidal solution is selected from a group comprising water, toluene, acetone, chloroform, ethyl alcohol, isopropyl alcohol, ethyl acetate, butyl acetate and methanol or any combination thereof.

In an embodiment in the process of the present disclosure, the colloidal solution has particle size ranging from about 1 nm to 1000 nm, preferably ranging from about 10 nm to 150 nm.

In another embodiment, in the process of the present disclosure, the colloidal solution has particle size of about 10 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm or about 150 nm.

In an embodiment, concentration of colloidal matter in the solution ranges from about 0.05 g/mL to 2 g/mL.

In another embodiment, the concentration of colloidal matter in the solution is about 0.05 g/mL, about 0.25 g/mL, about 0.5 g/mL, about 0.75 g/mL, about 1 g/mL, about 1.25 g/mL, about 1.5 g/mL, about 1.75 g/mL or about 2 g/mL.

In an embodiment, volume of colloidal dispersion for coating a 1"×1" substrate is about 60 µl.

In an embodiment, colloidal solution is coated on the transparent material by a technique selected from a group comprising, spin coating, dip coating, spray coating, roll coating or any combinations thereof, wherein the colloidal solution forms a film on the transparent material.

In an embodiment, the crackle template on the transparent material is formed by crackling of the film of colloidal solution, which is initiated through drying.

In a preferred embodiment, colloidal solution is coated on the transparent material by spin coating at 1000 rpm for 60 s at room temperature.

In an embodiment, the drying is carried out by techniques selected from a group comprising self-evaporation, IR radiation, light exposure, heating, spinning, rotating and cooling or any combination thereof.

In another embodiment, the drying is carried out at a temperature ranging from about −73° C. to about 87° C., preferably about 25° C.

In yet another embodiment, the drying is carried out at a temperature of about −73° C., about −65° C., about −60° C., about −55° C., about −50° C., about −45° C., about −40° C., about −35° C., about −30° C., about −25° C.,about −20° C., about −15° C., about −10° C., about −5° C., about 0° C., about 5° C., about 10° C., about 15° C., about 20° C., about 25° C., about 30° C., about 35° C., about 40° C., about 45° C., about 50° C., about 55° C., about 60° C., about 65° C., about 70° C., about 75° C., about 80° C., about 85° C. or about 87° C.

In an embodiment, to generate a crackle template, a colloidal dispersion in water/diluter (0.4 g/ml) is rigorously ultrasonicated for 10 min at room temperature (25° C.). Commonly available glass and quartz plates are used as substrates after washing with water, acetone and isopropyl alcohol and purging with nitrogen. 60 µl solution is used for spin coating at 1000 rpm for 60 s at room temperature (25° C.). The substrate gets dried during spin in air while crackle network pattern formed spontaneously in the coated layer.

In an embodiment, thickness of crackle template ranges from about 1 µm to 4 µm.

In a further embodiment, thickness of the crackle template is about 1 µm, 1.5 µm, about 2 µm, about 2.5 µm, about 3 µm, about 3.5 µm or about 4 µm.

The crackle template formed on the transparent material acts as a template mask for coating the metal on the said template.

In an embodiment, the coated metal is in any form selected from a group comprising mesh, wire and thin film or any combination thereof.

In a preferred embodiment, the metal is in the form of wire wherein thickness of the metal wire ranges from about 10 nm-1 µm, preferably about 100 nm.

In a further embodiment, the thickness of the metal wire is about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm or about 1 µm.

In an embodiment, the metal may be any metal or metal alloy except Mercury (Hg).

In a non-limiting embodiment, the metal is selected from a group comprising copper (Cu), silver (Ag), gold (Au), tin(Sn), aluminium (Al), Nickel (Ni) and alloys such as such aluminium (Al)-zinc (Zn) alloy (Al 3003), aluminium (Al)-silica (Si) alloy (Al 4343), copper (Cu)-nickel (Ni), Bronze, nickel (Ni)-chromium (Cr), steel, mild steel or any combinations thereof.

In an embodiment, metal deposition on the crackle template formed facilitates fabrication of patterned modified substrates, which aids in coating of graphene to obtain graphene based transparent conductive electrode (TCE).

In an embodiment, the pattern comprises void region having cell size (i.e. non-metallic region) ranging from about 25 µm to 100 µm.

In an embodiment, a metal precursor is coated on the crackle template by techniques selected from a group comprising electron beam evaporation (Telemark, USA) and physical vapour deposition system (Hind High Vacuum Co., India) or a combination thereof.

In an embodiment, amount of metal deposited on a template of size 10 cm×10 cm is ranging from about 100 mg to 2 g, preferably about 400 mg.

In another embodiment, the metal in the form of film has thickness ranging from about 10 nm to preferably about 100 nm.

In a further embodiment, thickness of metal film is about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm or about 1 µm, In an embodiment, after coating the metal on the crackle template, the modified substrate is subjected to lift-off wherein the crackle layer is dissolved by dipping in chloroform. The modified substrate after lift-off is left with metal network on top of it.

In an embodiment, metal network on the modified substrate is coated with graphene to form the graphene based TCE.

In an embodiment, the non-modified substrate is selected from a group comprising quartz, glass, toughened glass, mica, polymer and ceramic or any combination thereof.

Figure 1:
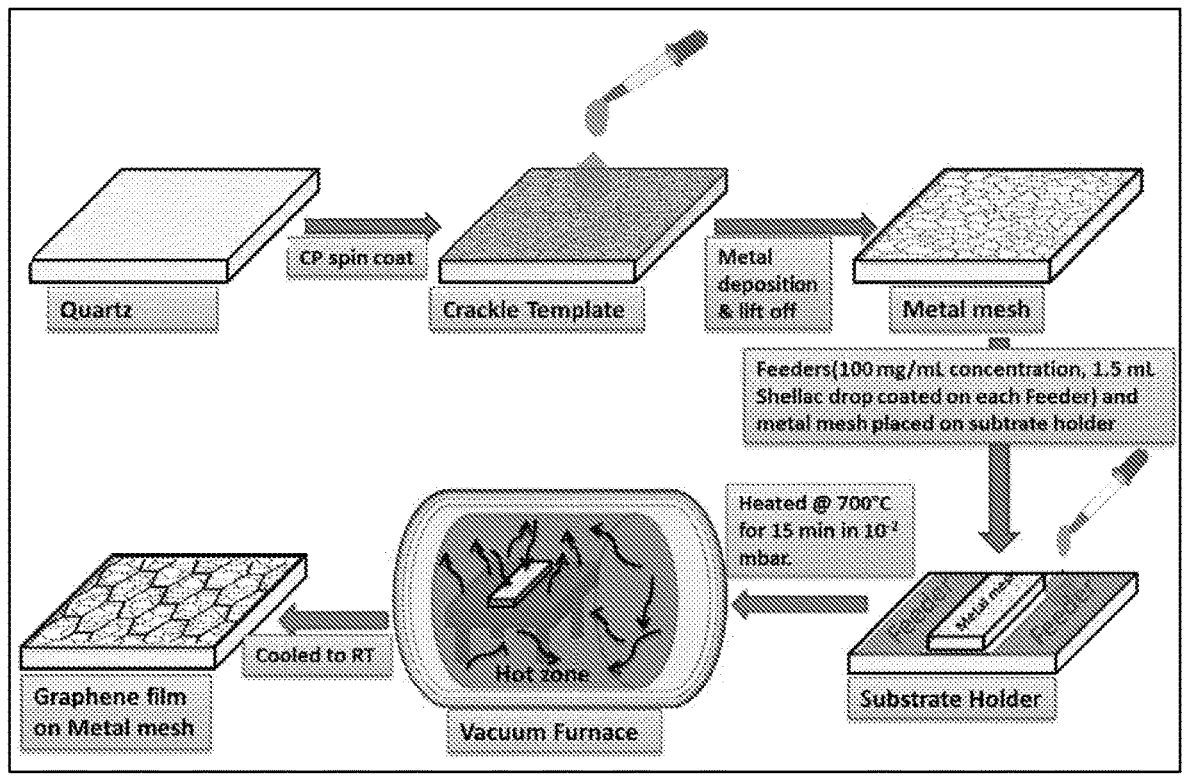

In an embodiment, FIG. 1 exemplifies the experimental setup of graphene based transparent conductive electrode production by the process of present disclosure. It shows schematic representation of fabricating crackle template film (produced using crack formation in film formed through colloidal solution) on transparent material. Subsequently, metal is deposited and the film is washed for lift off. Subsequent setup comprises a heating platform where the modified substrate is surrounded by at least one feeder coated with seedlac solution. The heating platform comprising the modified substrate and the at least one feeder coated with seedlac solution is placed in a heating furnace, whereby upon heating the furnace, the vapours of the seedlac is generated (seedlac is vaporized) and is deposited on the modified substrate having metal network, thereby forming graphene on the modified substrate to produce graphene based transparent conductive electrode.

Figure 2:
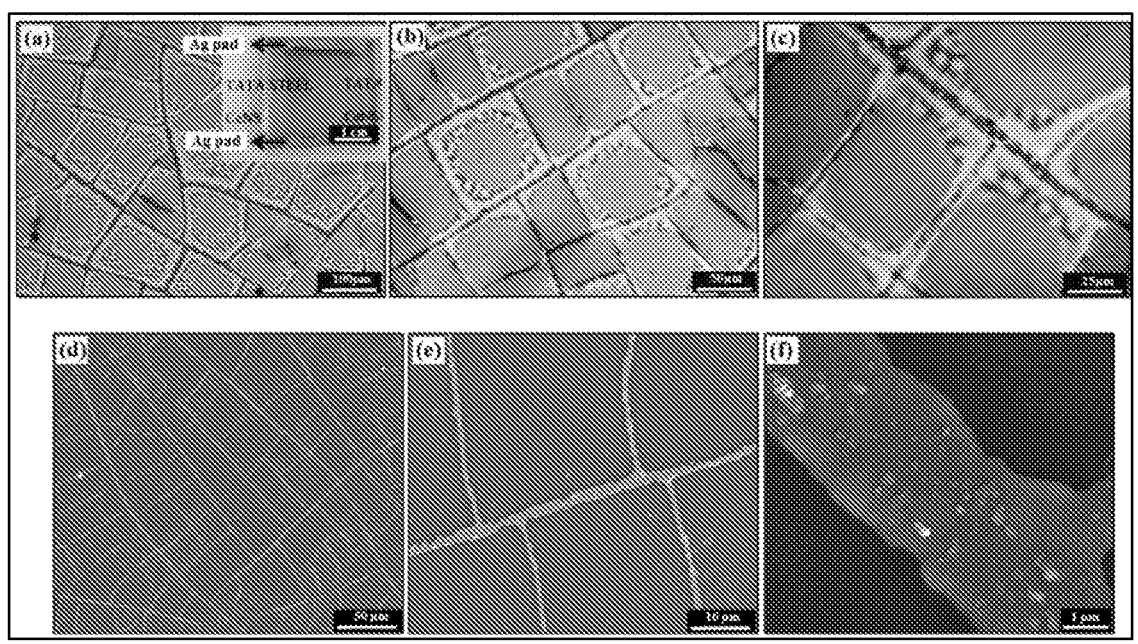

In an embodiment, FIG. 2 exemplifies the microscopic images, wherein FIGS. 2a-2c exemplifies optical microscopic images with different magnifications. Inset of FIG. 2a shows digital optical image of the graphene film lodged on metal mesh of the modified substrate. FIGS. 2d-2f exemplifies the SEM images of graphene in the graphene based TCE.

Figure 3:
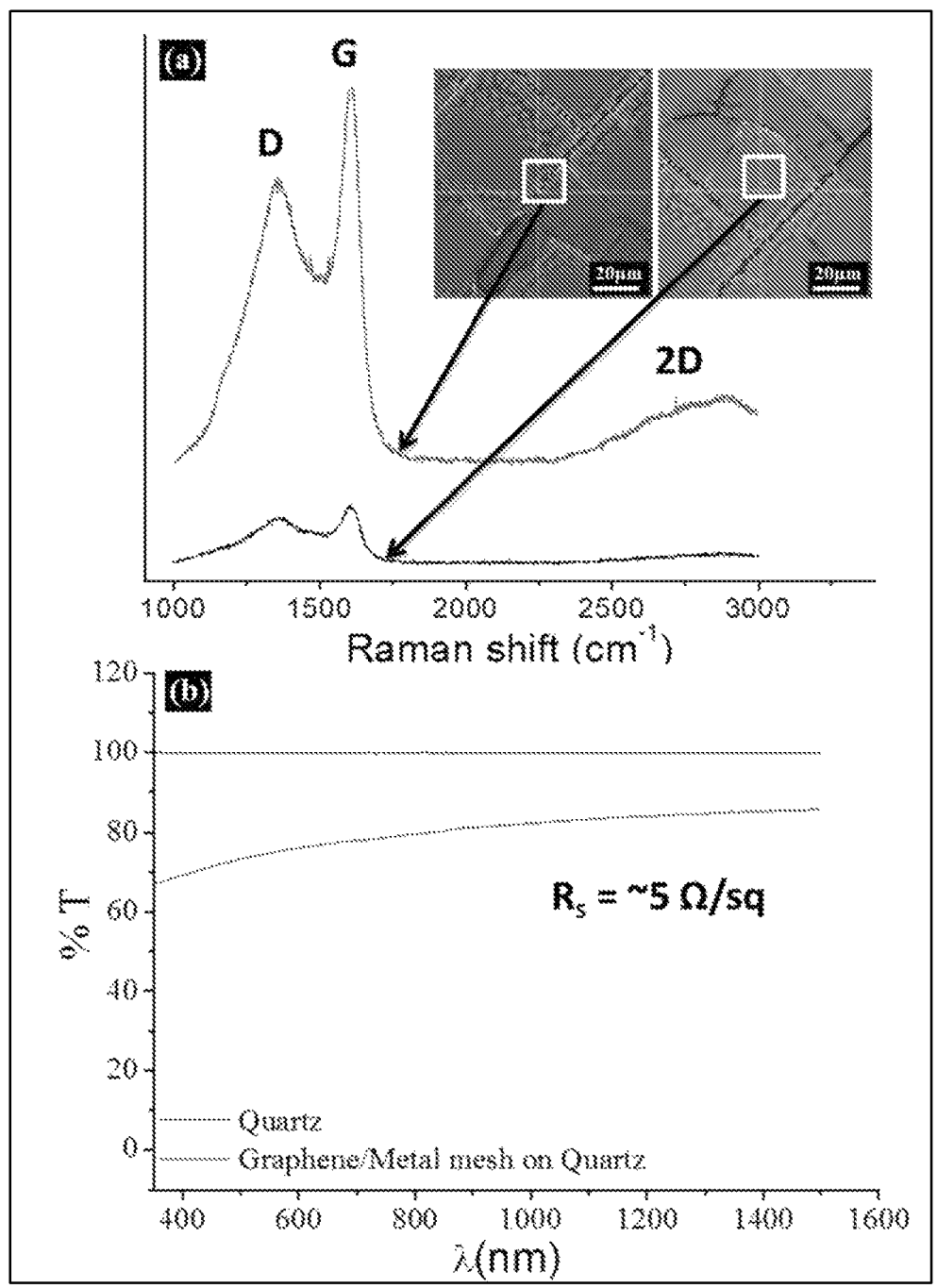

In an embodiment, FIG. 3 exemplifies the Raman and optical transmission spectra at different regions on the surface of graphene of the graphene based TCE. FIG. 3a exemplifies the Raman spectra of graphene film on metal mesh and off the metal mesh in said graphene based TCE. FIG. 3b exemplifies the transmission spectrum of Graphene Metal mesh network on quartz substrate with the transmission of about 80% in the visible range. The film is conducting all over the region with sheet resistance ($R_s$) of about <20 Ω/sq.

Figure 4:
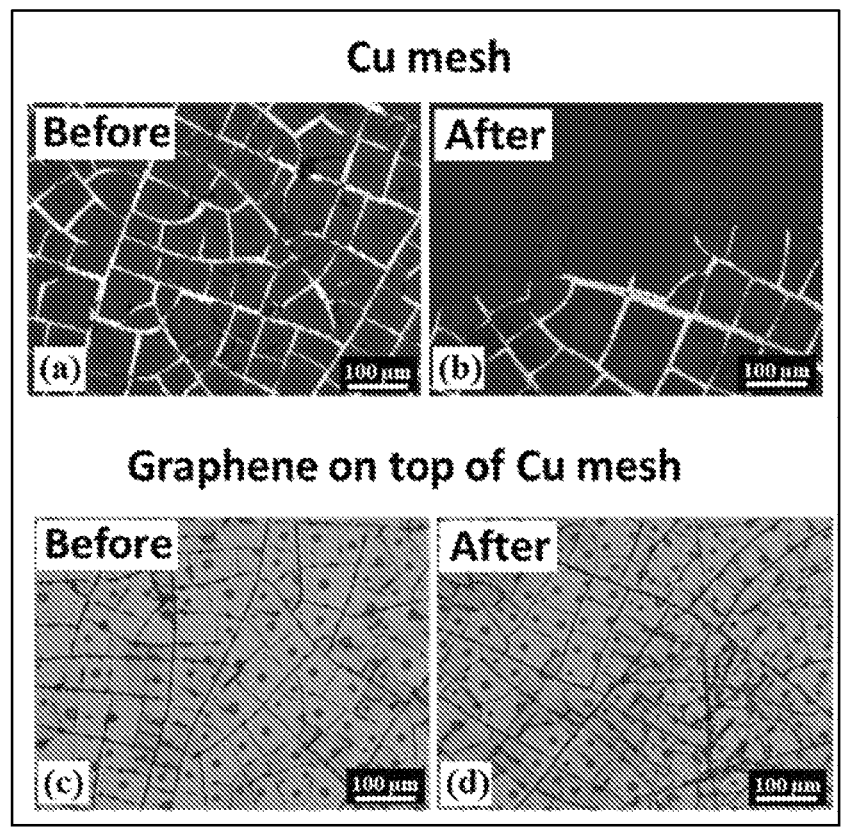
Figure 4:
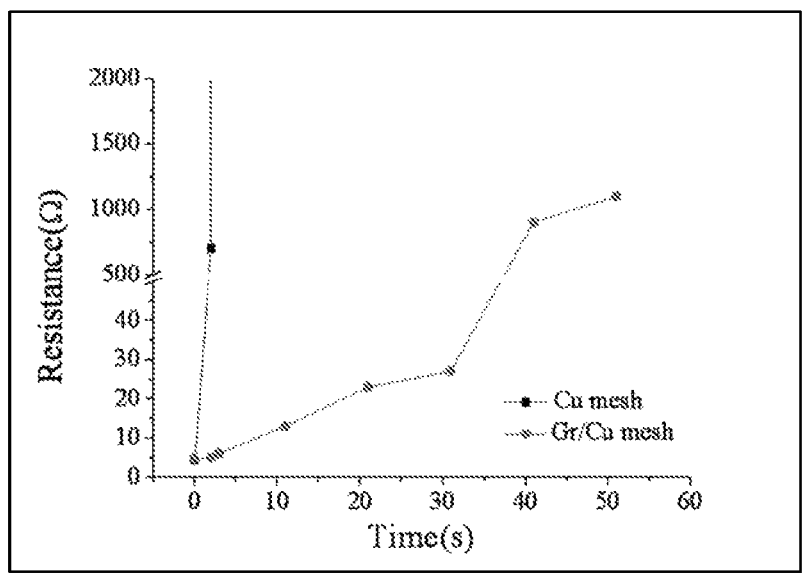

In an embodiment, FIG. 4 exemplifies the impermeable property of the graphene in graphene based TCE of the present disclosure, thereby indicating the protection of metal networking the said graphene based TCE. FIGS. 4a & 4c shows optical microscopic images taken before ferric chloride etching test on Cu mesh and graphene based TCE having Cu mesh.

FIGS. 4b & 4d shows optical microscopic images taken after ferric chloride (about 0.1 M) etching test on Cu mesh and graphene based TCE having Cu mesh after 30 seconds of etching, respectively, wherein the metal network underneath the graphene in the graphene based TCE and bare metal network are exposed to dilute etchant solution, respectively for about 30 seconds. Immediately after exposure the bare metal network starts corroding. On the other hand, the metal network/mesh in the graphene based TCE was intact without any signs of damage, demonstrating anticorrosion property and robustness of the graphene based TCE.

FIG. 4e shows the change in resistance with etching time in $FeCl_3$ solution. The resistance of the copper mesh alone changes drastically within 2 sec of $FeCl_3$ dip from 4.3 Ω to non-conducting as shown in plot (black line), whereas Gr/Cu mesh can withstand for quite long time; even after 10 s the resistance measured is ~13 Ω and after 50 s resistance is ~1100 Ω shown in plot (red line). From this plot, it can be understood that graphene coating is protecting the Cu mesh from corroding in $FeCl_3$ solution.

Figure 5:
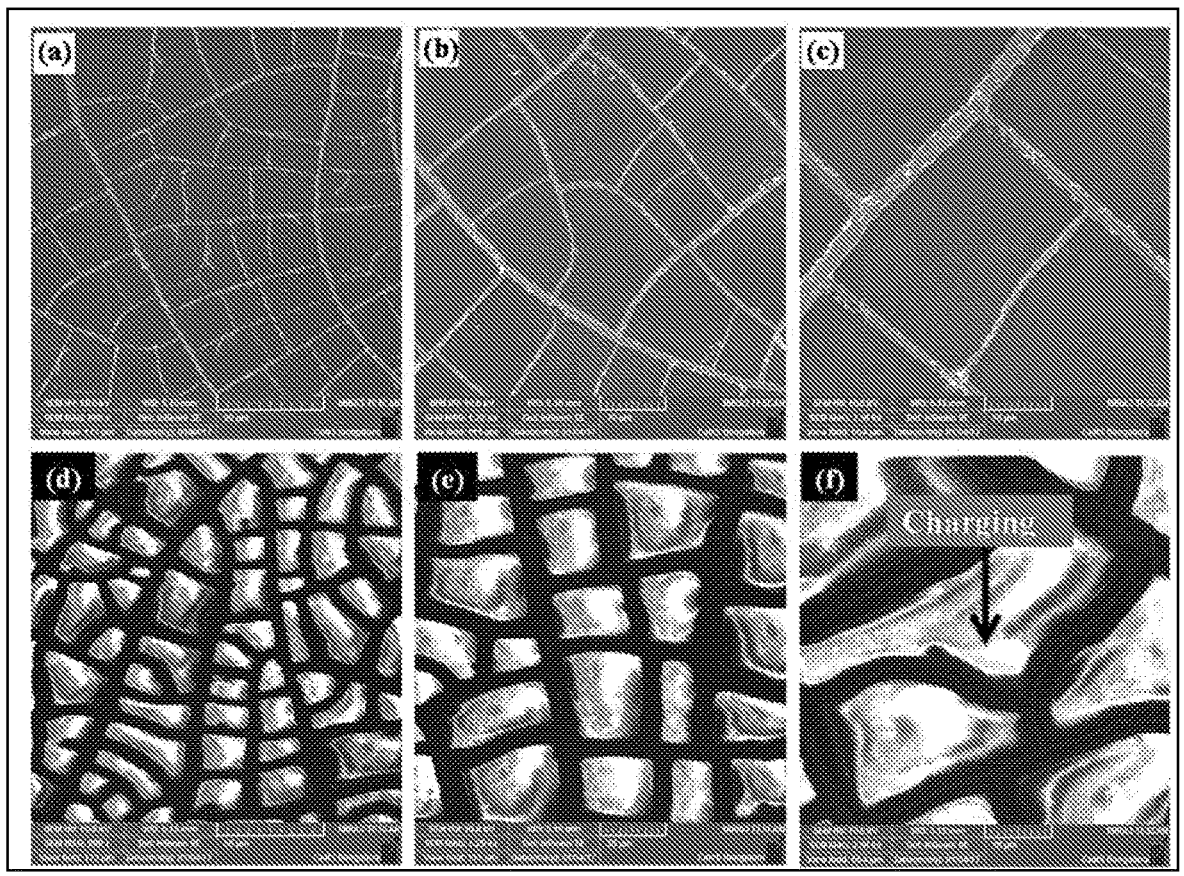
FIG. 5 illustrates SEM images of graphene based TCE having silver mesh.

In an embodiment, FIG. 5 substantiates the usefulness of graphene as continuous conducting film in graphene based TCE of the present disclosure. FIG. 5(a)-5(c) & 5(d)-5(f) exemplify the SEM image of graphene based TCE and metal network alone, respectively. The substrate having metal network alone shows effect of charging in non-conducting void regions of metal mesh, whereas the SEM measurement on graphene in the graphene based TCE does not show the charging effect, thereby demonstrating that the Graphene improves the continuity of conducting regions in the said graphene based TCE.

In an alternate embodiment, the present disclosure relates to a process for producing graphene based TCE, comprising steps of:

heating a non-modified substrate and at least one feeder;
contacting vapours of seedlac with the non-modified substrate;
cooling the non-modified substrate to produce coat of graphene on the non-modified substrate;
coating colloidal solution on the graphene coated non-modified substrate, followed by drying to obtain crackle template; and
depositing metal on the crackle template, followed by washing to produce the graphene based TCE.

In an embodiment, the non-modified substrate and the feeder comprising the seedlac are heated to a temperature ranging from about 400° C. to 1200° C. under vacuum at pressure ranging from about $10^{-1}$ mbar to $10^{-5}$ mbar for a time period ranging from about 1 minute to 120 minutes, whereby the seedlac on the feeder is vaporized and the substrate is contacted with the seedlac. The heating is done in a furnace, wherein the furnace is any electronic heating furnace, capable of being heated to a predetermined temperature.

In an alternate embodiment, the non-modified substrate and the feeder comprising the seedlacare heated to a temperature ranging from about 400° C. to 1200° C. under controlled atmosphere comprising argon, combination of argon and hydrogen or combination of nitrogen and hydrogen at a flow rate ranging from about 100 sccm to 500 sccm for a time period ranging from about 1 minute to 120 minutes, whereby the seedlac on the feeder is vaporized and the substrate is contacted with the seedlac.

In an embodiment, heating of the non-modified substrate and the at least one feeder comprising the seedlac causes the seedlac to vaporize and contact the non-modified substrate, thereby forming graphene coat on the non-modified substrate upon cooling to a temperature ranging from about 25° C. to 50° C.

In another embodiment, the temperature for the cooling is about 25° C., about 30° C., about 35° C., about 40° C., about 45° C. or about 50° C.

In an embodiment, the non-modified substrate is selected from a group comprising quartz, glass, toughened glass, mica, polymer and ceramic, or any combinations thereof.

In an embodiment, the colloidal solution comprises colloidal matter selected from a group comprising acrylic resin, acrylic resin nanoparticles, titanium dioxide, potassium tetraoctyl ammonium bromide, palladium benzyl thiolate, palladium hexadecylthiolate coffee powder and colloidal nano particles of other substances or any combination thereof.

In a preferred embodiment, the colloidal solution is an acrylic resin water based dispersion available commercially as crackle nail polish (Ming Ni Cosmetics Co., Guangzhou, China).

In an embodiment, solvent for preparing the colloidal solution is selected from a group comprising water, toluene, acetone, chloroform, ethyl alcohol, isopropyl alcohol, ethyl acetate, butyl acetate and methanol, or any combination thereof.

In an embodiment in the process of the present disclosure, the colloidal solution has particle size ranging from about 1 nm to 1000 nm, preferably ranging from about 10 nm to 150 nm.

In another embodiment, in the process of the present disclosure, the colloidal solution has particle size of about 10 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm or about 150 nm.

In an embodiment, concentration of colloidal matter in the solution ranges from about 0.05 g/mL to 2 g/mL.

In another embodiment, the concentration of colloidal matter in the solution is about 0.05 g/mL, about 0.25 g/mL, about 0.5 g/mL, about 0.75 g/mL, about 1 g/mL, about 1.25 g/mL, about 1.5 g/mL, about 1.75 g/mL or about 2 g/mL.

In an embodiment, volume of colloidal dispersion for coating a 1"×1" substrate is about 60 µl.

In an embodiment, colloidal solution is coated on the graphene coated non-modified substrate by a technique selected from a group comprising, spin coating, dip coating, spray coating, roll coating or any combinations thereof, wherein the colloidal solution forms a film on the transparent material.

In an embodiment, the crackle template on the graphene coated substrate is formed by crackling of the film of colloidal solution, which is initiated through drying.

In a preferred embodiment, colloidal solution is coated on the graphene coated substrate by spin coating at about 1000 rpm for about 60 seconds at temperature ranging from about 25° C. to 40° C.

In another embodiment, the temperature for spin coating is about 25° C., about 27.5° C., about 30° C., about 32.5° C., about 35° C., about 37.5° C. or about 40° C.

In an embodiment, the drying is carried out by techniques selected from a group comprising self-evaporation, IR radiation, light exposure, heating, spinning, rotating and cooling or any combination thereof.

In another embodiment, the drying is carried out at a temperature ranging from about −73° C. to about 87° C., preferably about 25° C.

In yet another embodiment, the drying is carried out at a temperature of about −73° C., about −65° C., about −60° C., about −55° C., about −50° C., about −45° C., about −40° C., about −35° C., about −30° C., about −25° C., about −20° C., about −15° C., about −10° C., about −5° C., about 0° C., about 5° C., about 10° C., about 15° C., about 20° C., about 25° C., about 30° C., about 35° C., about 40° C., about 45° C., about 50° C., about 55° C., about 60° C., about 65° C., about 70° C., about 75° C., about 80° C., about 85° C. or about 87° C.

In an embodiment, thickness of crackle template ranges from about 1 µm to 4 µm.

In a further embodiment, thickness of the crackle template is about 1 µm, 1.5 µm, about 2 µm, about 2.5 µm, about 3 µm, about 3.5 µm or about 4 µm.

The crackle template formed on the graphene coated non-modified substrate acts as a template mask for coating the metal on the said template. The coated metal is in any form selected from a group comprising mesh, wire and thin film or any combination thereof.

In a preferred embodiment, the metal is in the form of wire wherein thickness of the metal wire ranges from about 10 nm-1 µm, preferably about 100 nm.

In a further embodiment, the thickness of the metal wire is about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm or about 1 µm.

In an embodiment, a metal precursor is coated on the crackle template on the graphene coated non-modified substrate by techniques selected from a group comprising electron beam evaporation (Telemark, USA) and physical vapour deposition system (Hind High Vacuum Co., India) or a combination thereof.

In an embodiment, after coating the metal on the crackle template of the graphene coated non-modified substrate, the substrate is subjected to lift-off wherein the crackle layer is dissolved by dipping in chloroform. The graphene coated non-modified substrate after lift-off is left with metal network on top of it.

In an embodiment, the metal may be any metal or metal alloy except Mercury (Hg).

In a non-limiting embodiment, the metal is selected from a group comprising copper (Cu), silver (Ag), gold (Au), tin (Sn), aluminium (Al), Nickel (Ni) and alloys such as such aluminium (Al)-zinc (Zn) alloy (Al 3003), aluminium (Al)-silica (Si) alloy (Al 4343), copper (Cu)-nickel (Ni), Bronze, nickel (Ni)-chromium (Cr), steel, mild steel or any combinations thereof.

In an embodiment, the metal is deposited on the template formed by crackling of the film of resinous solution by a process selected from a group comprising, physical vapour deposition, sputtering and pulse laser deposition or any combinations thereof.

In an embodiment, amount of metal deposited on the graphene coated non-modified substrate of size 10 cm×10 cm is ranging from about 100 mg to 2 g, preferably about 400 mg.

In another embodiment, the metal in the form of film has thickness ranging from about 10 nm to 1 µm, preferably about 100 nm.

In a further embodiment, thickness of metal film is about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm or about 1 µm.

In an embodiment, the transparent material forming the non-modified substrate for the graphene based TCE is non-conductive material and wherein the transparent material is selected from a group comprising quartz, glass, toughened glass, mica, polymer and ceramic, or any combinations thereof. The transparent material is in a form selected from a group comprising sheet, rod, foil and mesh, or any combination thereof.

In an embodiment, the transparent material is used for forming the substrate after washing with water, acetone and isopropyl alcohol and purging with nitrogen.

In an embodiment, in the processes of producing the graphene based TCE, the feeder is selected from a group comprising quartz, glass, toughened glass, mica, polymer and ceramic, or any combinations thereof.

In alternate embodiment, the feeder includes but is not limiting to conductive material and non-conductive material, having high melting point ranging from about 500° C. to 4000° C.

In an embodiment, the melting point of the feeder is about 500° C., about 750° C., about 1000° C., about 1250° C., about 1500° C., about 1750° C., about 2000° C., about 2250° C., about 2500° C., about 2750° C., about 3000° C., about 3250° C., about 3500° C., about 3750° C. or about 4000° C.

In another embodiment, the feeder comprises seedlac solution.

In a non-limiting embodiment, the seedlac is dissolved in alcohol, wherein the alcohol is selected from a group comprising ethanol, isopropanol and tert-butyl alcohol, or any combinations thereof, wherein the concentration of seedlac is about 10 g to 200 g per litre of the alcohol.

In an embodiment, the concentration of the seedlac is about 10 g, about 25 g, about 50 g, about 75 g, about 100 g, about 125 g, about 150 g, about 175 g or about 200 g.

In an exemplary embodiment, the seedlac solution is prepared by sonicating seedlac in the alcohol selected from a group comprising ethanol, isopropanol and tert-butyl alcohol or any combinations thereof, at a temperature ranging from about 25° C. to 90° C., preferably about 25° C., for a time period ranging from about 10 minutes to 60 minutes, preferably about 30 minutes.

In an exemplary embodiment, the seedlac solution is casted on the feeder by a technique including but not limited to dipping and spin coating, followed by drying the feeder surface in air atmosphere for a time period ranging from about 1 minute to 10 minutes; thereafter, said feeder is put into a furnace.

In a non-limiting embodiment, the thickness of the graphene in the graphene based TCE is ranging from about 1 nm to 100 nm. Further, the thickness of the graphene is dependent on the concentration of seedlac dosing. Hence, in order to obtain a graphene of predetermined thickness, a predetermined amount of seedlac is required to be coated on the feeder, thereby during heating the sufficient amount of seedlac evaporates from the feeder and is deposited on the modified substrate, leading to predetermined thickness of graphene in the graphene based TCE.

In an embodiment, the thickness of the graphene in the graphene based TCE is about 1nm, about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm or about 100 nm.

In a preferred embodiment, the thickness of the graphene in the graphene based TCE is about 5 nm.

Figure 6:
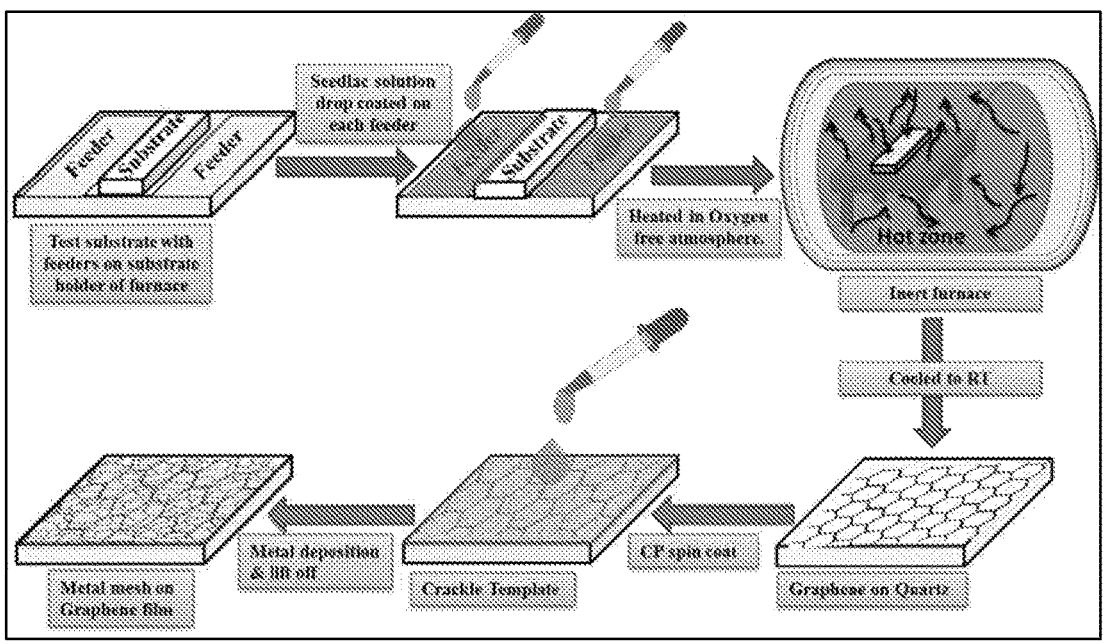
FIG. 6 illustrates experimental step up for production of graphene based TCE from non-modified substrate.

In an embodiment, FIG. 6 depicts the experimental step up for fabricating crackle template film (produced using crack formation in colloidal film) on graphene coated non-modified, and subsequent metal deposition followed by washing of the film and lift off.

In an embodiment, FIG. 7 illustrates charging is in voids of metal network due to lack of conducting region on substrate having only metal network and absence of charging on hybrid graphene metal network due to presence of graphene providing new channels in between the metal wires to collect the charge carriers.

In an embodiment, FIG. 8 illustrates Raman spectra of Graphene and Transmission spectrum at different regions of the said Graphene.

In an embodiment, FIG. 9 illustrates measurement of contact angle of the graphene based TCE. FIGS. 9(a) and 9(b) depict digital images of contact angle measured with 3 µL drop of De-ionized water on Cu metal mesh/quartz TCE and FIGS. 9(c) and 9(d) depict the images for graphene/Cu mesh/quartz TCE.

In an embodiment, FIG. 10 illustrates corrosion resistant studies of graphene coated Cu-mesh. The figure depicts Tafel plot (sweep rate: 5 mV/s) for Cu mesh (black) and graphene coated Cu-mesh (red).

In an embodiment, in the process of producing graphene based TCE, the vaporized seedlac is transformed to graphene under optimized experimental conditions by bond rearrangement through removal of hydroxyl functional groups, thereby causing the production of large area graphene on modified substrate having metal network to produce graphene based TCE.

In an exemplary embodiment, the process of the instant disclosure produces graphene based TCE with area of about 10 cm×10 cm, wherein said process can be fabricated to produce large area graphene based TCE.

In another embodiment, graphene based TCE has a thickness ranging from about 10 nm to 1100 nm.

In a further embodiment, the graphene based TCE has thickness of about 10 nm, about 50 nm, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm, about 1000 nm, about 1050 nm or about 1100 nm.

In an exemplary embodiment, the vaporized seedlac employed in the process of the present disclosure has the advantage of forming large area graphene on modified and non-modified substrates. Particularly, it provides said advantage for modified substrates without the limitation of requiring a smooth and uniform substrate and is capable of forming graphene on any regions of modified substrate including but not limiting to metallic regions and non-metallic regions.

In an embodiment, the present disclosure further relates to system for producing graphene based TCE.

In an exemplary embodiment, the system for producing graphene based TCE, comprises the components:
substrate holder for holding modified substrate or non-modified substrate and at least one feeder;
furnace for heating the substrate holder comprising modified substrate or non-modified substrate and at least one feeder; and
cooling device to cool the modified substrate or non-modified substrate to room temperature to produce graphene based TCE.

In an embodiment, the substrate holder is any platform that is capable of holding the modified substrate and at least one feeder at a predetermined distance.

In another embodiment, the substrate holder is made of material capable of sustaining high temperature.

In a further embodiment, the substrate holder is made of material selected from a group comprising Alumina, Boron Nitride Silica Mix, Boron Nitride, Quartz or any combination thereof.

In an embodiment, the furnace is any electronic heating furnace, capable of heating the platform to a predetermined temperature.

In an embodiment, the present disclosure relates to a graphene based transparent conductive electrode, obtained by the process described above.

In an embodiment, the graphene in the said graphene based transparent conductive electrode is impermeable, thereby protecting the metal network on the modified substrate.

In an embodiment, the graphene based transparent conductive electrode is resistant to corrosion.

In a further embodiment, the graphene based TCE has a transmission of about 60% to 85% and has sheet resistance ($R_s$) of about 1 Ω/sq to 100 Ω/sq.

In another embodiment, the graphene based TCE has a transmission of about 60%, about 65%, about 70%, about 75%, about 80% or about 85%.

In still another embodiment, the graphene based TCE has sheet resistance ($R_s$) of about 1 Ω/sq, about 10 Ω/sq, about 20 Ω/sq, about 30 Ω/sq, about 40 Ω/sq, about 50 Ω/sq, about 60 Ω/sq, about 70 Ω/sq, about 80 Ω/sq, about 90 Ω/sq or about 100 Ω/sq.

In an embodiment, the graphene based TCE has a corrosion rate of about $3.331 \times 10^{-13}$ m/s.

In another embodiment, the graphene based TCE has a contact angle ranging from about 91°-92°.

In a further embodiment, the graphene based TCE has a contact angle of about 91°, about 91.25°, about 91.5°, about 91.75° or about 92°.

In a still further embodiment, graphene improves the continuity of conducting regions in the said graphene based TCE; thus, the graphene based TCE does not show the charging effect.

In an embodiment, the graphene based TCE of the present disclosure has application in the fields such as optoelectronics In a further embodiment, the graphene based TCE of the present disclosure is used in manufacture of product selected from a group comprising photovoltaic cells, transparent heaters, electronic smart windows and Light Emitting Diodes (LED).

In an embodiment, the present disclosure further describes the advantages of producing graphene based transparent conducting electrode (TCE) by the process of the present disclosure are
the process is simple and is easily adapted to coat any substrate without any limitation.
the process does not employ any hazardous chemicals, hence is an environmental friendly process.
the process does not employ complicated lithography steps of using expansive mask for template or applying photoresist and electron beam for template formation, as conventional lithography processes are cumbersome and expensive. However, the instant process is able to produce large area metal network without any limitation.
since metal deposition on crackle template creates metal wires on the transparent material, there is no joints at crossing junction of wires on the material. Thereby, creating a continuous tunnel for charge carriers without heating spots, unlike in the process of the prior art which requires laying of metal wires in random orientation, which creates junction resistance at crossover points.
the process of the instant disclosure can coat graphene on the curved surfaces for the preparation of graphene based TCE, unlike the processes known in the prior art.
the process is commercially viable and economical, unlike the processes known in the prior art.
The graphene coating on the substrate to prepare graphene based TCE can be performed in both vacuum and in the controlled atmosphere using inert gases, independently.

In an embodiment, the foregoing descriptive matter is illustrative of the disclosure and not a limitation. Providing working examples for all possible combinations of modified or non-modified substrates formed of transparent materials such as but not limiting to glass and quartz plates; metals such as but not limiting to copper (Cu), silver (Ag), gold (Au), tin (Sn), aluminium (Al), and alloys such as such aluminium (Al)-zinc (Zn) alloy (Al 3003), aluminium (Al)-silica (Si) alloy (Al 4343), copper (Cu)-nickel (Ni), Bronze, nickel (Ni)-chromium (Cr), steel, mild steel; and process parameters such as but not limiting to time, temperature and pressure, is considered redundant.

While considerable emphasis has been placed herein on the particular features of this disclosure, it will be appreciated that various modifications can be made, and that many changes can be made in the preferred embodiments without departing from the principles of the disclosure. Those skilled in the art will recognize that the embodiments herein can be practiced with modification within the spirit and scope of the embodiments as described herein.

EXAMPLES

Example 1

Preparation of Graphene Based Transparent Conductive Electrode

A. Preparation of Modified Substrate

Colloidal solution for crack template formation is made by adding 0.4 g of resinous particle in solvent (water or diluter) of volume of about 1 ml at a temperature ranging from about 25° C. to 40° C. and sonicating the solution for about 10 minutes. The colloidal solution (about 0.25 ml) is coated over the quartz (transparent material) surface (2"×2") by drop casting/spin coating followed by air drying the quartz at room temperature (about 25° C.) for 60 sec which results in crack formation (crackle template) [K. D. M. Rao et al. Adv. Mater. Interfaces 2014, 1, 1400090 and Giridhar Udapi Rao et al. (WO2014136039A) describe the formation of crackle template]. The crackle template is placed inside PVD chamber and 400 mg of copper or any other metal is loaded. The chamber is closed to get pressure of $10^{-5}$ to $10^{-6}$ mbar in 80 min to 90 min and the chamber temperature is maintained at 25° C. to 30° C. The metal is evaporated once the chamber crosses $10^{-5}$ mbar pressure. Once the metal deposition is done the sample is taken out and lift-off is performed by dipping the template in chloroform solution for 1 min to 2 min to remove the colloidal material, the substrate after lift-off is left with metal network on quartz substrate.

B. Coating Graphene on the Modified Substrate to Produce Graphene Based TCE

A solution of the seedlac precursor (about 100 mg/mL) is made by adding 10 g of seedlac in isopropanol solvent of volume of about 100 ml at a temperature ranging from about 25° C. to 90° C. by gentle mixing using magnetic stirrer for about 15 minutes. Said solution is kept as it is in stationary state for about 2 hours to 3 hours for settling down the contamination. The seedlac solution (about 1.5 ml) is coated over the quartz (feeder) surface (2"×2") by drop casting.

The experimental setup as described in FIG. 1 is used, wherein feeder having seedlac solution is kept away from the modified substrate, but in the same heating zone such that the vapor formed from the former surrounds the blank metal mesh in the modified substrate. The chamber is heated using an electro-heating furnace to a temperature of about 780° C. for about 15 minutes under vacuum at pressure of about $10^{-2}$ mbar, followed by cooling the modified substrate to room temperature, whereby forming graphene [IN201621041721 describes the process of formation graphene from seedlac] on the modified substrate to obtain graphene based TCE.

Example 2

Characterization of the Graphene Based Transparent Conductive Electrode (TCE)

The obtained hybrid metal mesh graphene electrode is characterized by FESEM, Raman and UV-vis spectroscopy [FIG. 3.b].

High resolution SEM image demonstrates that the graphene in the graphene based TCE is free from structural defects [FIG. 2(f)]. Optical images (a-c) and SEM (d-f) images of the said graphene based TCE are shown in FIG. 2.

Raman spectra data confirms the presence of graphene on the metal mesh in the graphene based TCE [FIG. 3]. The Raman spectra data further shows the transmission spectrum of the graphene in the graphene based TCE, wherein the optical transmission/transmittance is about 60% to 85% in the visible range. The graphene based TCE is found to be conducting all over the said graphene region with $R_s$ of 1 Ω/sq to 100 Ω/sq [illustrated in FIG. 3]. The reduced $R_s$ showcased by the graphene based TCE is attributed to the combined effect of metal mesh network and graphene.

Graphene based TCE having copper metal mesh is compared with bare copper mesh substrate, to demonstrate the protective property of graphene based TCE of the instant disclosure. The graphene based TCE having copper mesh and bare copper mesh substrate are exposed to dilute ferric chloride solution, respectively for about 50 seconds. After exposure for about 3 seconds, the bare copper mesh substrate becomes insulating while the graphene based TCE having copper mesh remains conducting for at least about 30 seconds [illustrated in FIG. 4]. This demonstrates improved durability of the graphene based transparent conductive electrode (TCE). Table 1 illustrates the resistance demonstrated by bare copper mesh substrate and graphene based TCE upon exposure to the etching solution.

Continuity of conducting property of graphene based TCE is analyzed by SEM measurement. The SEM measurement of the graphene based TCE is compared with that of bare metal mesh substrate. SEM results show charging at non-conducting regions in the bare metal mesh substrate. Presence of graphene in the TCE provides conducting path to collect the charge carriers and improve continuity of conducting surface [Figure 5].

TABLE 1

Resistance exhibited by bare copper mesh substrate and graphene based TCE upon exposure to etching solution.

| Time in (sec) after FeCl$_3$ drop | Resistance (Ω) | |
|---|---|---|
| | Bare Cu mesh substrate | Gr on Cu mesh |
| Before | 4.3 | 4.8 |
| 2 | 700 | 5 |
| 3 | Metal get | 6 |
| 11 | etched and no | 13 |
| 21 | conductivity | 23 |
| 31 | measured | 27 |
| 41 | | 900 |
| 51 | | 1100 |

TABLE 2 contact angle data for 3 set of values measured at different location of Cu mesh/quartz and gr/Cu mesh/quartz sample.

| Contact angle of the Graphene based TCE having copper metal mesh is measured by determining digital images the contact angle with 3 µL drop of Di water on the surface of the electrode. Said measurement is compared between Cu mesh/quartz and graphene/Cu mesh/quartz | Contact angle measured (in degrees) | |
| --- | --- | --- |
| [FIG. 9]. S.I. No | Cu mesh/quartz | Gr/Cu mesh/quartz |
| 1 | 68.2 | 91.5 |
| 2 | 65.3 | 91.0 |
| 3 | 66.8 | 91.8 |

Corrosion resistance property of graphene on Cu-mesh is studied by electrochemical investigations using CH instruments (Model: CH660E, Austin, USA) in three electrode configuration.

In a conventional 3-electrode configuration, Cu-mesh or graphene coated Cu-mesh are employed as working electrodes, Pt as counter electrode and standard Ag/AgCl as reference electrode. The area of the working electrode is 0.98 cm$^2$ and 1.28 cm$^2$ for Cu-mesh and graphene coated Cu-mesh respectively in a 0.1 M NaCl electrolyte at room temperature (25° C.). The cathodic and anodic polarization measurements are performed at a scan rate of 5 mV/s. The corrosion potential (Ecorr) and corrosion current (Icorr) are derived through extrapolation from Tafel polarization curve. The corrosion rate is calculated using equation given below.

$$CR = (Icorr \times K \times EW)/(\rho \times A)$$

where, K, corrosion rate constant=3272 mm/year, EW=equivalent weight, 31.7 g for Cu, ρ, material density=8.94 g/cm$^3$ for Cu and the sample area A in cm$^2$, Icorr is current density in A/cm$^2$.

The corrosion resistance of graphene to underlying Cu-mesh is been studied using electrochemical measurements [FIG. 10]. Using Tafel analysis [FIG. 1], the Tafel polarization curve for graphene/Cu-mesh shows a positive shift (181 mV) of corrosion potential and a lower corrosion current compared to bare Cu-mesh (−15 mV). The corrosion current (Icorr) values are found to be $1.159 \times 10^{-6}$ Acm$^{-2}$ and $4.63 \times 10^{-5}$ Acm$^{-2}$ for graphene/Cu-mesh and Cu-mesh, respectively. Accordingly, the corrosion rates are estimated to be $3.331 \times 10^{-13}$ m/s and $1.738 \times 10^{-11}$ m/s, respectively. It is significant that the corrosion rate is 13 times lower for graphene/Cu-mesh compared to that of bare Cu-mesh.

Example 3

Production of Graphene Based Transparent Electrode Prepared by the Alternate Process of the Instant Disclosure Feeder having seedlac solution is kept away from the substrate (quartz), but in the same heating zone such that the vapor formed from the feeder surrounds the blank substrate, while the chamber is heated using an electro-heating furnace to a temperature of about 780° C. for about 15 minutes under vacuum at pressure of about $10^{-2}$ mbar, followed by cooling the substrate to room temperature, whereby forming graphene on quartz, the experimental set up is illustrated in FIG. 6.

Colloidal solution for crack template formation is made by adding 0.4 g/l of resinous particle in solvent of volume of about 100 ml at a temperature ranging from about 25° C. to 40° C. by gentle mixing using magnetic stirrer for about 5 minutes, then sonicating the solution for about 10 minutes. The colloidal solution (about 0.25 ml) is coated over the graphene coated substrate surface (2"×2") by drop casting/spin coating followed by air drying at room temperature (about 25° C.) for 60 s which result in crack formation on the substrate. The crackle template is placed inside PVD chamber and 400 mg of copper or any other metal is loaded. The chamber is closed to get pressure of $10^{-5}$ to $10^{-6}$ mbar in 80 min to 90 min and the chamber temperature is maintained at 25° C. to 30° C. The metal is evaporated once the chamber crosses $10^{-5}$ mbar pressure. Once the metal deposition is done the sample is taken out and lift-off is performed by dipping the template in chloroform solution for 1 min to 2 min to remove the colloidal material, the substrate after lift-off is left with metal network on quartz substrate.

Example 4

Characterization of the Graphene Based Transparent Conductive Electrode Prepared by the Alternate Process of the Present Disclosure The obtained graphene based transparent conductive electrode is characterized by FESEM, Raman and UV-vis spectroscopy.

Raman spectral measurements confirms the presence of graphene underneath the metal mesh in the graphene based TCE. The Raman spectra data further shows the transmission spectrum of the graphene based TCE, wherein the transmission is 60% to 85% with no absorption features (illustrated in FIG. 7c).

The graphene based TCE is found to be conducting all over the said graphene region with sheet resistance (Rs) of about 6.5Ω/sq. The reduced Rs showcased by the graphene based TCE is attributed to the combined effect of metal mesh network and the graphene film.

FIG. 8 substantiates the continuous conducting property of graphene based transparent conducting electrode. FIG. 8 exemplifies SEM measurement of bare metal mesh substrate (d-f) and graphene based TCE (a-c), wherein charging at non-conducting regions of bare metal mesh substrate is observed. On the other hand, presence of graphene in the graphene based TCE provides conducting path to collect the charge carriers and improves continuity of conducting surface.

Apart from copper, metals such as copper (Cu), silver (Ag), gold (Au), tin (Sn), aluminium (Al), Nickel (Ni) and alloys such as such aluminium (Al)-zinc (Zn) alloy (Al 3003), aluminium (Al)-silica (Si) alloy (Al 4343), copper (Cu)-nickel (Ni), Bronze, nickel (Ni)-chromium (Cr), steel, mild steel can also be used to prepare the graphene based TCE.

We claim:

1. A process for producing a graphene based transparent conductive electrode (TCE), wherein said process comprises steps of:
   heating a modified substrate or a non-modified substrate and at least one feeder;
   contacting vapours of seedlac with the modified substrate or the non-modified substrate; and either one of:
cooling the modified substrate to obtain a coat of graphene on the modified substrate, thereby producing the graphene based TCE; or
cooling the non-modified substrate to obtain a coat of graphene on the non-modified substrate, followed by coating the graphene coated non-modified substrate with a metal, and washing the graphene coated non-modified substrate to produce the graphene based TCE;
wherein the modified substrate comprises a transparent material having cracked metal; and
wherein the metal coating on the graphene coated non-modified substrate is cracked metal.

2. The process as claimed in claim 1, wherein the modified substrate or the non-modified substrate and the at least one feeder are heated to a temperature ranging from about 400° C. to 1200° C. under vacuum at a pressure ranging from about $10^{-1}$ mbar to $10^{-5}$ mbar for time period ranging from about 1 minute to 120 minutes or under controlled atmosphere comprising argon, nitrogen and hydrogen, or any combinations thereof, having a flow rate ranging from about 100 sccm to 500 sccm for a time period ranging from about 1 minute to 120 minutes.

3. The process as claimed in claim 1, wherein the at least one feeder comprises the seedlac at a concentration ranging from about 10 g/l to 200 g/l; wherein the at least one feeder is selected from a group comprising quartz, glass, toughened glass, mica, polymer and ceramic, or any combinations thereof; and wherein the seedlac is in solution form, casted on the at least one feeder by a technique selected from a group comprising spin coating, dipping, spraying, bar coating, slot coating and drop casting or any combinations thereof, followed by drying the at least one feeder comprising the seedlac in normal air atmospheric pressure for a time period ranging from about 1 minute to 10 minutes.

4. The process as claimed in claim 1, wherein the heating of the modified substrate or the non-modified substrate and the at least one feeder comprising the seedlac causes the seedlac to vaporize and contact the modified substrate or the non-modified substrate, thereby forming a graphene coat on the modified substrate of the non-modified substrate upon cooling to a temperature ranging from about 25° C. to 50° C.

5. The process as claimed in claim 1, wherein the modified substrate is produced by a process comprising steps of:
coating a colloidal solution on the transparent material;
drying the colloidal solution on the transparent material to obtain a crackle template; and
coating a metal on the crackle template, followed by washing the crackle template to obtain the modified substrate.

6. The process as claimed in claim 5, wherein the colloidal solution is selected from a group comprising acrylic resin, acrylic resin nanoparticles, titanium dioxide, potassium tetraoctyl ammonium bromide, palladium benzyl thiolate, palladium hexadecylthiolate coffee powder and colloidal nano-particles of other substances or any combination thereof; wherein the colloidal solution has a particle size ranging from about 1 nm to 1000 nm; wherein the colloidal solution comprises a solvent selected from a group comprising water, toluene, acetone, chloroform, ethyl alcohol, isopropyl alcohol, ethyl acetate, butyl acetate and methanol or any combination thereof; wherein the transparent material is selected from a group comprising quartz, glass, toughened glass, mica, polymer and, ceramic or any combinations thereof; and wherein the transparent material is in a form selected from a group comprising sheet, rod, foil and mesh, or any combination thereof; and wherein the metal is selected from a group comprising nickel, copper, aluminum, chromium, tungsten, bronze, tin gold and alloys or any combinations thereof, and wherein the alloy is selected from a group comprising steel, mild steel, Al—Zn alloy, Al—Si alloy, Cu—Ni and Ni—Cr, bronze or any combinations thereof.

7. The process as claimed in claim 5, wherein the colloidal solution is coated on the transparent material by a technique selected from a group comprising, spin coating, dip coating, spray coating, roll coating or any combinations thereof; and wherein the crackle template on the transparent material is formed by crackling of a film of the colloidal solution during drying or annealing of the film at a temperature ranging from about 30° C. to 100° C.

8. The process as claimed in claim 5, wherein the metal is coated on the crackle template by a technique selected from a group comprising electron beam evaporation and physical vapour deposition system or a combination thereof, wherein the metal is a metal precursor in solution form; and wherein the metal is selected from a group comprising copper (Cu), silver (Ag), gold (Au), tin (Sn), aluminium (Al), and alloys such as such aluminium (Al)-zinc (Zn) alloy, aluminium (Al)- silica (Si) alloy, copper (Cu)- nickel (Ni), Bronze, nickel (Ni)-chromium (Cr), steel, mild steel, or any combinations thereof.

9. The process as claimed claim 5, wherein the washing is performed with chloroform; and wherein the washing removes any film of the colloidal solution not bound to the metal.

10. The process as claimed in claim 1, wherein the metal coating on the graphene coated non-modified substrate is obtained by a process comprising steps of:
coating a colloidal solution on the graphene coated non-modified substrate;
drying the colloidal solution on the graphene coated non-modified substrate to obtain a crackle template on the graphene coated non-modified substrate; and
coating a metal on the crackle template, followed by washing the crackle template to obtain the metal coating on the graphene coated non-modified substrate.

11. The process as claimed in claim 10, wherein the colloidal solution is selected from a group comprising acrylic resin, acrylic resin nanoparticles, titanium dioxide, potassium tetraoctyl ammonium bromide, palladium benzyl thiolate, palladium hexadecylthiolate coffee powder and colloidal nano-particles of other substances or any combination thereof; wherein the colloidal solution has a particle size ranging from about 1 nm to 1000 nm; wherein the colloidal solution comprises a solvent selected from a group comprising water, toluene, acetone, chloroform, ethyl alcohol, isopropyl alcohol, ethyl acetate, butyl acetate and methanol or any combination thereof; wherein the non-modified substrate is selected from a group comprising quartz, glass, toughened glass, mica, polymer and, ceramic or any combinations thereof; and wherein the metal is selected from a group comprising nickel, copper, aluminum, chromium, tungsten, bronze, tin gold and alloys or any combinations thereof, and wherein the alloy is selected from a group comprising steel, mild steel, Al—Zn alloy, Al—Si alloy, Cu—Ni and Ni—Cr, bronze or any combinations thereof.

12. The process as claimed in claim 10, wherein the colloidal solution is coated on the graphene coated non-modified substrate by a technique selected from a group comprising, spin coating, dip coating, spray coating, roll coating or any combinations thereof; and wherein the crackle template on the graphene coated non-modified substrate is formed by crackling of a film of the colloidal solution during drying or annealing of the film at a temperature ranging from about 30° C. to 100° C.

13. The process as claimed in claim 10, wherein the metal is coated on the crackle template by a technique selected from a group comprising electron beam evaporation and physical vapour deposition system or a combination thereof, wherein the metal is a metal precursor in solution form; and wherein the metal is selected from a group comprising copper (Cu), silver (Ag), gold (Au), tin (Sn), aluminium (Al), and alloys such as such aluminium (Al)-zinc (Zn) alloy, aluminium (Al)- silica (Si) alloy, copper (Cu)- nickel (Ni), Bronze, nickel (Ni)-chromium (Cr), steel, mild steel, or any combinations thereof.

14. The process as claimed in claim 10, wherein the washing is performed with chloroform; and wherein the washing removes film of the colloidal solution not bound to the metal.

15. The process as claimed in claim 1, wherein the process comprises steps of:

heating a modified substrate and at least onefeeder;

contacting vapours of seedlac with the modified substrate; and cooling the modified substrate to obtain a coat of graphene on the said modified substrate to produce the graphene based transparent conductive electrode.

16. The process as claimed in claim 1, wherein the process comprises steps of:

heating a non-modified substrate and at least one feeder;

contacting vapours of seedlac with the non-modified substrate;

cooling the non-modified substrate to produce a coat of graphene on the non-modified substrate;

coating a colloidal solution on the graphene coated non-modified substrate, followed by drying to obtain the crackle template; and depositing metal on the crackle template, followed by washing to produce the graphene based TCE.

* * * * *